(12) United States Patent
Yao et al.

(10) Patent No.: US 11,621,212 B2
(45) Date of Patent: Apr. 4, 2023

(54) BACKING PLATE WITH MANUFACTURED FEATURES ON TOP SURFACE

(71) Applicant: International Business Machines Corporation, Armonk, NY (US)

(72) Inventors: Yuan Yao, Tarrytown, NY (US); Shurong Tian, Mount Kisco, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 16/720,599

(22) Filed: Dec. 19, 2019

(65) Prior Publication Data

US 2021/0193557 A1 Jun. 24, 2021

(51) Int. Cl.
*H01L 23/40* (2006.01)
*H05K 1/18* (2006.01)
*H01R 13/639* (2006.01)
*H01R 12/70* (2011.01)
*H01R 13/24* (2006.01)

(52) U.S. Cl.
CPC ....... *H01L 23/4006* (2013.01); *H01R 13/639* (2013.01); *H05K 1/18* (2013.01); *H01L 23/4093* (2013.01); *H01L 2023/4081* (2013.01); *H01R 12/707* (2013.01); *H01R 13/24* (2013.01); *H05K 2201/10189* (2013.01)

(58) Field of Classification Search
CPC ............ H05K 1/18; H05K 2201/10189; H01L 23/4006; H01L 23/4093; H01L 2023/4081; H01R 12/707; H01R 13/639; H01R 13/24
See application file for complete search history.

(56) References Cited

U.S. PATENT DOCUMENTS

| | | | |
|---|---|---|---|
| 5,761,036 A | 6/1998 | Hopfer et al. | |
| 6,078,500 A * | 6/2000 | Beaman | H01L 23/3107 165/185 |
| 6,282,093 B1 | 8/2001 | Goodwin | |
| 6,386,890 B1 | 5/2002 | Bhatt et al. | |
| 6,475,011 B1 | 11/2002 | Sinha et al. | |
| 6,557,675 B2 * | 5/2003 | Iannuzzelli | F16F 7/1028 188/380 |

(Continued)

FOREIGN PATENT DOCUMENTS

| | | |
|---|---|---|
| CN | 201408392 Y | 2/2010 |
| JP | 2014165231 A | 9/2014 |
| WO | 2017105642 A1 | 6/2017 |

OTHER PUBLICATIONS

Corbin et al., "Land grid array sockets for server applications", IBM J. Res. & Dev., vol. 46, No. 6, Nov. 2002, © 2002 IBM, 16 pages.

*Primary Examiner* — Edwin A. Leon

(74) *Attorney, Agent, or Firm* — Edward J. Wixted, III

(57) ABSTRACT

In an apparatus for coupling integrated circuits to printed circuit boards, a backing plate with manufactured features on the top surface includes a module lid; a planar structure; a device seated in the planar structure, with the module lid in contact with the top surface of the device; and a backing plate that contains manufactured features on one side. The backing plate is in contact with the planar structure, and a plurality of fastening mechanisms couple together the lid, the device, the planar structure, and the backing plate.

20 Claims, 2 Drawing Sheets

(56) References Cited

U.S. PATENT DOCUMENTS

| | | | |
|---|---|---|---|
| 6,702,587 B2 | 3/2004 | Weiss | |
| 6,703,560 B2 * | 3/2004 | Coico | H01L 21/50 |
| | | | 174/535 |
| 6,850,411 B1 * | 2/2005 | Patel | H01L 23/32 |
| | | | 361/704 |
| 6,872,284 B2 * | 3/2005 | Ivanov | C23C 14/3407 |
| | | | 204/192.13 |
| 7,344,919 B2 | 3/2008 | Mcallister et al. | |
| 7,443,026 B2 | 10/2008 | Goldmann et al. | |
| 7,766,691 B2 | 8/2010 | Pandey et al. | |
| 9,426,918 B2 * | 8/2016 | Bet-Shliemoun | H05K 7/1092 |
| 9,490,560 B2 * | 11/2016 | Chawla | H01R 12/79 |
| 9,944,055 B2 * | 4/2018 | Sewell | B32B 37/0053 |
| 10,170,391 B2 * | 1/2019 | Dickover | H05K 7/2039 |
| 10,242,891 B2 | 3/2019 | Fricker et al. | |
| 10,369,656 B2 * | 8/2019 | Takigawa | H01J 37/3426 |

\* cited by examiner

Section A-A

Section B-B

BACKING PLATE WITH MANUFACTURED FEATURES ON TOP SURFACE

BACKGROUND

The present invention relates generally to the field of sockets for coupling integrated circuits to printed circuit boards, and more particularly to a backing plate with manufactured features on the top surface.

Semiconductor devices, or integrated circuits (ICs), such as microprocessors, are typically mounted to a mechanical base support containing a conductive network of traces and holes, commonly called a substrate, and attached to a printed circuit board (PCB) through a socket. The socket interfaces with the package to connect signals from the package (and the IC) to other devices on the PCB. Several technologies exist for semiconductor device sockets, including pin grid array (PGA), ball grid array (BGA), and land grid array (LGA).

The LGA is a type of surface-mount packaging for an IC that is notable for having the pins on the socket (when a socket is used) rather than the integrated circuit. LGA packaging is related to ball grid array (BGA) and pin grid array (PGA) packaging. The LGA is a packaging technology with a rectangular grid of contacts on the underside of a package. The contacts are to be connected to a grid of contacts on the PCB. The contacts can either be made by using an LGA socket, or by soldering.

The LGA package is typically used as a physical interface for microprocessors. Compared to CPUs in PGA packages, the LGA package reduces the likelihood of the chip being damaged either before or during installation as there are no pins that can be accidentally bent. By transferring the pins to the motherboard, it is possible to design the socket to physically shield the pins from damage.

SUMMARY

Embodiments of the present invention disclose an apparatus that includes a module lid; a planar structure; a device seated in the planar structure, with the module lid in contact with the top surface of the device; and a backing plate that contains manufactured features on one side. The backing plate is in contact with the planar structure, and a plurality of fastening mechanisms couple together the lid, the device, the planar structure, and the backing plate.

BRIEF DESCRIPTION OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
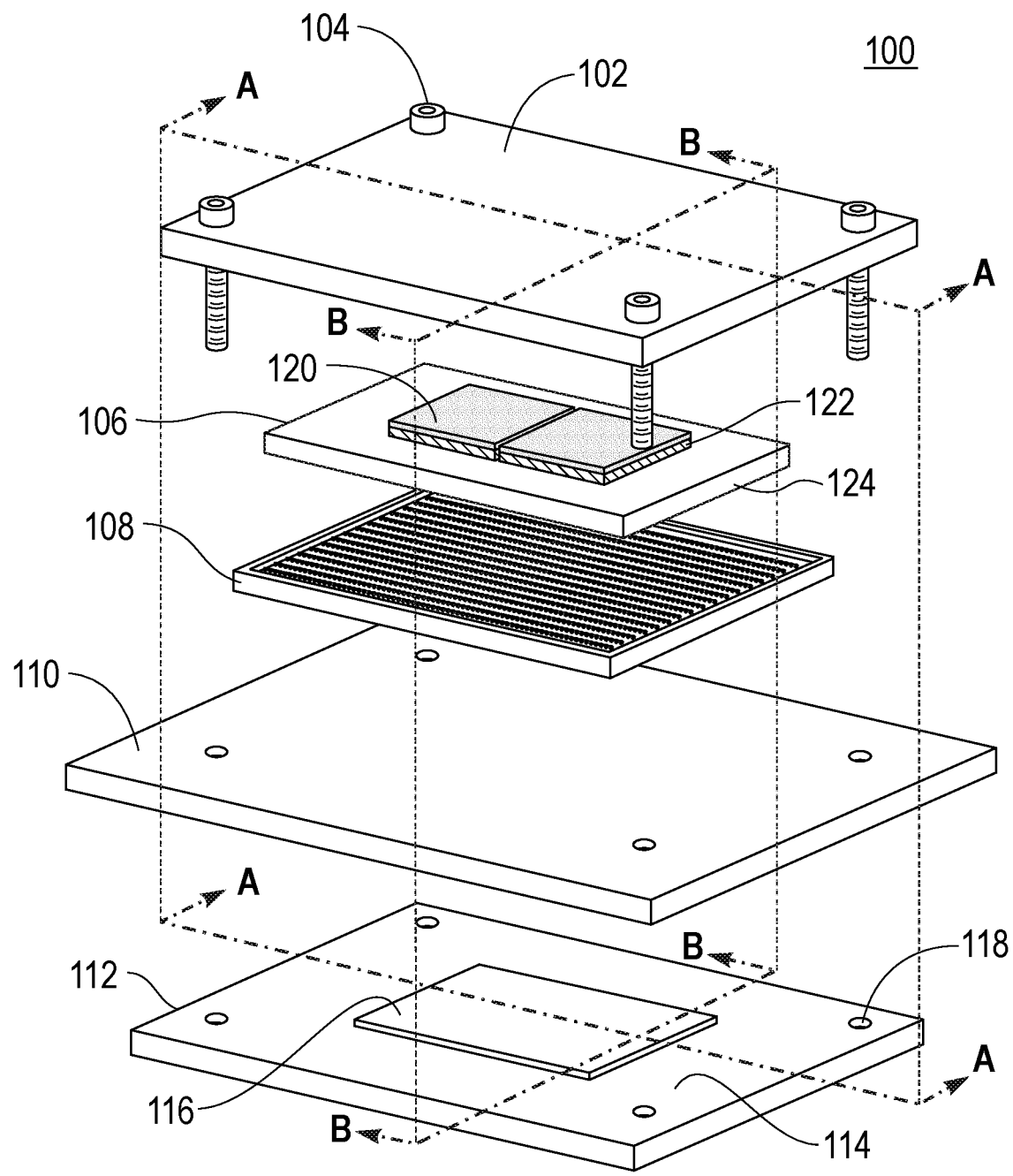
FIG. 1 is an exploded perspective view of an LGA socket, including a backing plate with manufactured features on the top surface, in accordance with an embodiment of the present invention.

Embodiments of the present invention present a backing plate with manufactured features on top surface, for an LGA connector. In a typical integrated circuit package with an LGA connector, an IC sits on a chip module which mates with a PCB via the LGA connector. A lid, which can include a heat sink or a cold plate, sits on top of the chip and a backing plate supports the PCB from underneath. The lid and backing plate are mechanically coupled together, typically via fasteners. The top surface of the LGA connector has an array of springs mating with an array of pads on the bottom surface of the LGA chip module. A large amount of force is usually needed to push the LGA connector and module against each other and to make sure all the springs and pads between them make full contact. The mating force is typically created by tightening the fasteners. A common challenge is that due to initial thermal stress of the chip and high tightening force from the fasteners, mechanical deformation is created on the bottom surface of the module and the top surface of the LGA connector, resulting in nonuniform mating force between these two surfaces. The spring pins around the center of the LGA connector often don't get enough mating force to make full contact with the module.

One existing approach to alleviate this nonuniform mating force issue is to insert polymer layers between the backing plate and the PCB. These layers are inserted underneath the area where insufficient mating force is usually observed (often the center area) to locally provide additional mating force. From another perspective, the function of these polymer layers can also be viewed as correcting the deformation or unevenness of the contact surfaces between the LGA and the module. Due to the relatively soft nature of the polymer material, compared to metal, it is difficult to control the thickness of these polymer layers when they are compressed. It is also difficult to achieve accurate lateral alignment of the polymer layers. Thus, the correction from these polymer layers is relatively coarse. In addition, manufacturing, stocking, handling and attaching these polymer layers, which often have multiple sizes, add cost and complexity to the assembly process.

Another existing approach is to insert a "force adjustable member," typically a plate with a screw to adjust the force, between the backing plate and the PCB. By turning the screw underneath the force adjustable member, additional mating force is generated locally at points where there might not otherwise be sufficient mating force. The disadvantage of this approach is that the force adjustable member and the screw used to adjust the force both take vertical space and make the overall structure height much larger than without the force adjustable member. In high packaging density systems, where vertical space limits the overall density, this approach is not optimal due to its relatively large height.

Generally, the present invention relates to a novel backing plate with manufactured features on the top surface for an LGA socket assembly which provides electrical and mechanical connection of the IC in an LGA package to a PCB. The present invention utilizes manufactured features on the top surface of the backing plate to correct the deformation or unevenness of the contact surfaces between the IC or chip module and the LGA socket. Comparing the present invention to the existing approaches, the manufactured features are integrated onto the backing plate and do not require extra material stocking, handling and assembling processes. The manufactured features also have more accurately controlled vertical and lateral dimensions when compressed and thus permit arbitrary definition of the contact force distribution. In addition, the present invention has a much thinner backing plate assembly and therefore a lower overall packaging structure height, which make it more desirable in high packaging density systems.

FIG. 1 is an exploded perspective view of an example of a typical LGA socket assembly, designated 100, which includes a backing plate with manufactured features on the top surface, according to some embodiments of the present invention. The LGA socket assembly 100 illustrated in FIG. 1 is typical of the type of LGA socket assemblies that could utilize the novel aspects of the backing plate with manufactured features on the top surface. It should be apparent to a person of skill in the art that many such LGA socket assemblies are available that could be improved by the use of the backing plate with manufactured features on the top surface.

LGA socket assembly 100 includes a chip module 106 coupled to a PCB 110 by an LGA connector 108. The chip module 106 includes a substrate 124, two ICs 122, and two thermal interface materials 120. A module lid 102 is coupled to a backing plate 112, which includes manufactured features 116 on its top surface 114, by a plurality of fastening mechanisms 104. In some embodiments, the module lid 102 may consist of a heat sink. In other embodiments, the module lid 102 may consist of a cold plate.

The backing plate 112 contains a plurality of through-holes 118. The through-holes 118 are used to allow retension of the backing plate 112 to the module lid 102, to support an electronic component (e.g., chip module 106) seated in the LGA connector 108. The backing plate 112, PCB 110, and module lid 102 may be secured to one another using the plurality of fastening mechanisms 104. Fastening mechanisms 104 may be screws, nuts and bolts, snaps, clips, or any other through-hole fastening mechanism suitable for use in a printed circuit board assembly process.

The backing plate 112 has a top surface 114 which integrates manufactured features 116. The manufactured features 116 protrude from the top surface 114 of the backing plate 112 to apply pressure to the underside of the PCB 110 to compensate for any mechanical deformation created on the bottom surface of the chip module 106 and the top surface of the LGA connector 108. The manufactured features 116 on the top surface 114 of the backing plate 112 create height variations to compensate for deformation under coupling force and to improve contact force uniformity between the array of pads on the bottom surface of the chip module 106 and the array of springs on the top surface of the LGA connector 108. The mechanical deformation is typically caused by the initial thermal stress of the ICs 122 and the high tightening force from the fastening mechanisms 104, resulting in nonuniform mating force between these two surfaces. The manufactured features 116 also have more accurately controlled vertical and lateral dimensions when compressed and thus permit arbitrary definition of the contact force distribution. This arbitrary definition of the contact force distribution improves the contact force uniformity between the bottom surface of the LGA connector 108 and the top surface of the planar structure (e.g., PCB 110).

The manufactured features 116 integrated onto the top surface 114 of the backing plate 112 permit thinner backing plates underneath modules being compressed against a planar structure such as the PCB 110, for example, a computer motherboard. By integrating height variation features onto the backing plate 112, the backing plate can be thinner compared to the traditional constant thickness backing plate design. This backing plate design also allows tailoring the force distribution as a function of lateral position.

In an embodiment, the overall height of backing plate 112 is less than 6 mm. In another embodiment, the overall height of backing plate 112 is between 4 mm and 6 mm. In an embodiment, the height of manufactured features 116 (dimension 132 in FIG. 2) is less than 0.1 mm. In another embodiment, the height of manufactured features 116 (dimension 132 in FIG. 2) is between 0.04 mm and 0.06 mm.

FIG. 1 shows one embodiment of this invention where the manufactured features 116 is a single bump, or protrusion, manufactured on the top surface of the backing plate 112 around the center location. In other embodiments, the manufactured features 116 may be a plurality of bumps based on the geometry of the chip module 106. In some embodiments, the manufactured features 116 is a rectangular shape, as illustrated in FIG. 1. In other embodiments, manufactured features 116 is a circular shape. In yet other embodiments, manufactured features 116 is any shape as may be appropriate to apply the necessary force to the bottom of the PCB 110 to correct the deformation or unevenness of the contact surfaces between the chip module 106 and the PCB 110.

In some embodiments, the manufactured features 116 on the top surface of the backing plate 112 is a single platform at the center, which can be machined or ground at relatively low cost. In some embodiments, the manufactured features 116 on the top surface of the backing plate 112 are steps of multiple heights which require additional effort to manufacture but create more customized backing force distribution.

Figure 2:
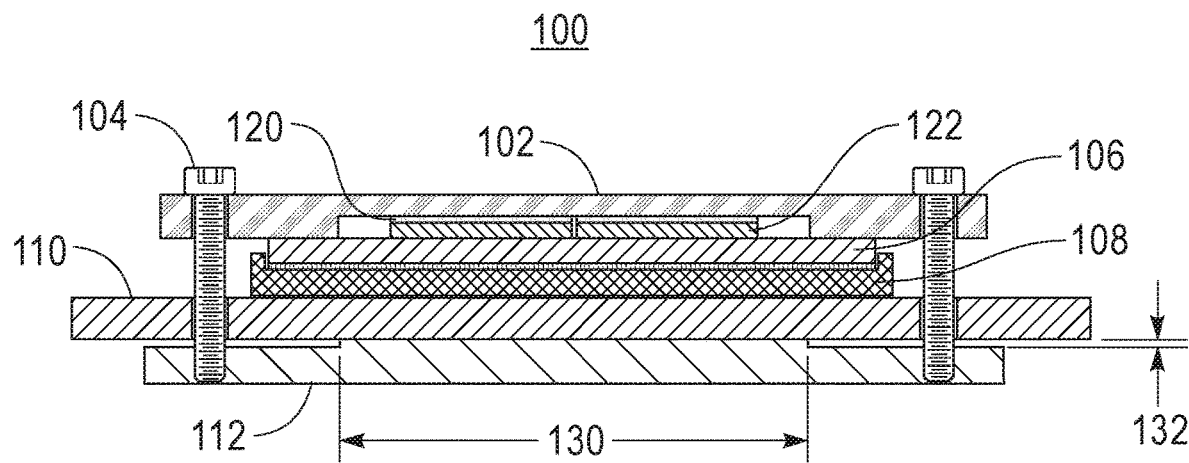
FIG. 2 is a front cross section view of an LGA socket, including a backing plate with manufactured features on the top surface, in accordance with an embodiment of the present invention.
Figure 3:
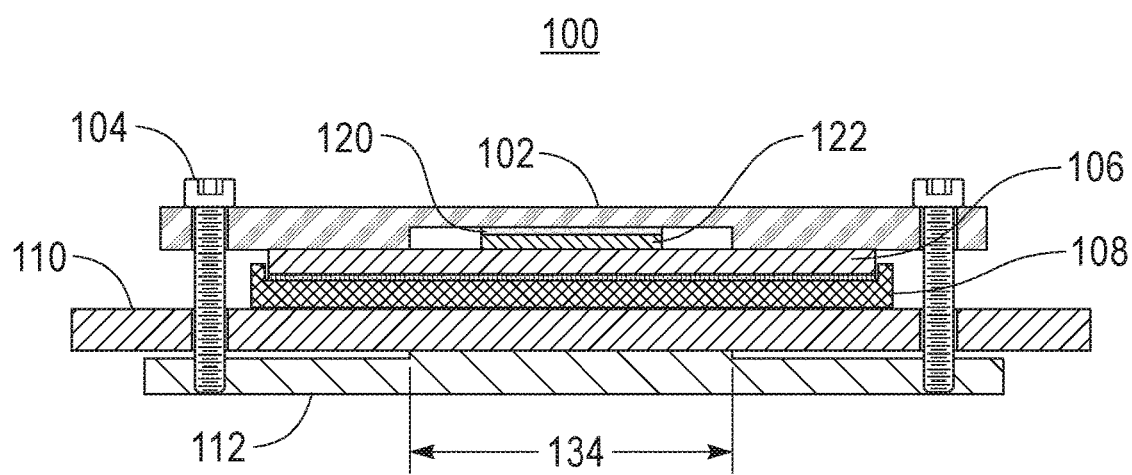
FIG. 3 is a side cross section view of an LGA socket, including a backing plate with manufactured features on the top surface, in accordance with an embodiment of the present invention.

FIG. 2 and FIG. 3 represent cross sectional views through example LGA socket assembly 100 of FIG. 1. In FIG. 2, the dimensions of the manufactured features 116 includes a width 130 and a dimension 132. In FIG. 3, the dimensions of the manufactured features 116 includes a depth 134. In some embodiments, the height of manufactured features 116 is constant. In other embodiments, the height of manufactured features 116 varies. In some embodiments, the height of manufactured features 116 tapers from the center to the outer edge. In various embodiments, the height of manufactured features 116 may vary in any appropriate manner as may be necessary to correct the deformation or unevenness of the contact surfaces between the chip module 106 and the PCB 110.

In some embodiments, the backing plate 112 is made of a stiff metal, such as steel. In other embodiments, the backing plate 112 is made of any other stiff material, provided that the material has a spring constant sufficient to apply the appropriate compressive force to maintain proper contact between chip module 106 and LGA connector 108, and can be manufactured within the tolerances required for manufactured features 116. In an embodiment, the tolerances required for manufactured features 116 is +/−0.01 mm. In some embodiments, where the backing plate 112 is manufactured from an electrically conductive material, a thin insulating layer is interposed between the bottom surface of the PCB 110 and the top surface of the backing plate 112.

In some embodiments, the manufactured features 116 and the backing plate 112 are a single unit. In other embodiments, the manufactured features 116 are separate parts assembled to the backing plate 112. In some embodiments, the manufactured features 116 are separate parts that are glued to backing plate 112. In other embodiments the manufactured features 116 are attached to backing plate 112 by soldering. In still other embodiments, manufactured features 116 are separate parts that inserted into a cavity machined into top surface 114 of backing plate 112. This allows manufactured features 116 of different thicknesses or contours to be inserted into the backing plate 112 to allow use of the backing plate 112 for different applications.

In some embodiments, the backing plate 112 and the manufactured features 116 may be milled from a single block of material. In other embodiments, the backing plate 112 and the manufactured features 116 may be produced using a molding process. In some embodiments, the backing plate 112 and the manufactured features 116 may be produced by additive manufacturing techniques, for example, 3D printing. In other embodiments, the backing plate 112 and the manufactured features 116 may be manufactured by any appropriate method as would be known to a person of skill in the art.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An apparatus comprising:
    a module with a module lid;
    a printed circuit board having a top side and a bottom side;
    the module above the top side of the printed circuit board;
    a backing plate having a top side and a bottom side, wherein the backing plate includes one or more protrusions formed in the top side, and wherein the one or more protrusions directly contact the bottom side of the printed circuit board under the module; and
    a plurality of fastening mechanisms, wherein the plurality of fastening mechanisms couple together the module lid, the module, the printed circuit board, and the backing plate.

2. The apparatus of claim 1, wherein the printed circuit board further comprises:
    a land grid array (LGA) connector, wherein the LGA connector is coupled to the top side of the printed circuit board, and further wherein the LGA connector is operative to receive the module therein; and
    a thin insulating layer interposed between the bottom side of the printed circuit board and the top side of the backing plate.

3. The apparatus of claim 2, wherein the LGA connector is soldered to the PCB.

4. The apparatus of claim 1, wherein the one or more protrusions on the top side of the backing plate create height variations to compensate for deformation of contact surfaces between the top side of the LGA connector and a bottom surface of the module under a coupling force.

5. The apparatus of claim 4, wherein the height variations improve contact force uniformity between the top side of the LGA connector and the bottom surface of the module.

6. The apparatus of claim 1, wherein vertical dimension and lateral dimensions of the one or more protrusions on the top side of the backing plate permit arbitrary definition of a contact force distribution between a bottom surface of the module and the top side of the printed circuit board.

7. The apparatus of claim 1, wherein the one or more protrusions on the top side of the backing plate is a single protrusion forming a platform in a center portion of the backing plate under the module.

8. The apparatus of claim 1, wherein the one or more protrusions on the top side of the backing plate are steps of multiple heights, wherein the steps of multiple heights create a customized backing force distribution.

9. The apparatus of claim 1, wherein the plurality of fastening mechanisms are selected from the group consisting of screws, nuts and bolts, studs, snaps, and clips.

10. The apparatus of claim 1, wherein the one or more protrusions formed in the first side of the backing plate have a height of less than 0.1 mm.

11. The apparatus of claim 1, wherein the one or more protrusions formed in the first side of the backing plate have a height of between 0.04 mm and 0.06 mm.

12. An apparatus coupling integrated circuits to printed circuit boards comprising:
    a backing plate having a top side and a bottom side, wherein one or more protrusions formed in the top side creates height variations to compensate for deformation of contact surfaces between an LGA connector and a module under coupling force, and further wherein the one or more protrusions apply a force directly to a bottom surface of a printed circuit board under the LGA connector.

13. The apparatus of claim 12, wherein vertical dimensions and lateral dimensions of the one or more protrusions on the top side of the backing plate permit arbitrary definition of a contact force distribution between a top side of the LGA connector and a bottom surface of the module.

14. The apparatus of claim 12, wherein the one or more protrusions on the top side of the backing plate form a single raised platform in a center of the backing plate, wherein the raised platform has a flat, solid surface.

15. The apparatus of claim 12, wherein the one or more protrusions on the first side of the backing plate are steps of multiple heights, wherein the steps of multiple heights create a customized backing force distribution between a top side of the LGA connector and a bottom surface of the module.

16. The apparatus of claim 12, wherein the one or more protrusions formed in the first side of the backing plate have a height less than 0.1 mm.

17. The apparatus of claim 12, wherein the one or more protrusions formed in the top side of the backing plate have a height that tapers from a center of the one or more protrusions to outer edges of the one or more protrusions.

18. The apparatus of claim 12, wherein the module includes a module substrate, one or more semiconductor devices, a module lid, and a thermal interface material between each of the one or more semiconductor devices and the module lid.

19. The apparatus of claim 12, further comprising:
    a plurality of fasteners each in a hole in corners of the backing plate and printed circuit board, wherein the plurality of fasteners couple together the module, the LGA connector, the printed circuit board, and the backing plate.

20. The apparatus of claim 7, wherein the single protrusion is the rectangular-shaped platform of the backing plate with a flat surface that is without one or more holes in the rectangular shaped platform of the backing plate.

* * * * *